(12) United States Patent
Crowder et al.

(10) Patent No.: US 8,828,147 B2
(45) Date of Patent: Sep. 9, 2014

(54) DEVICE AND METHOD FOR LOOSENING A POLYMER LAYER FROM A SURFACE OF A SUBSTRATE

(75) Inventors: Matt Crowder, Allen, TX (US); Ronald Holzleitner, Scharnstein (AT); Thomas Glinsner, St. Florian/Inn (AT); Friedrich Paul Lindner, Schärding (AT); Erich Thallner, St. Florian (AT)

(73) Assignee: EV Group GmbH, St. Florian (AT)

( * ) Notice: Subject to any disclaimer, the term of this patent is extended or adjusted under 35 U.S.C. 154(b) by 725 days.

(21) Appl. No.: 13/078,110

(22) Filed: Apr. 1, 2011

(65) Prior Publication Data
US 2011/0265822 A1 Nov. 3, 2011

(30) Foreign Application Priority Data
Apr. 29, 2010 (EP) ..................... 10004509

(51) Int. Cl.
*B08B 3/00* (2006.01)
*H01L 21/67* (2006.01)

(52) U.S. Cl.
CPC ...... *H01L 21/6708* (2013.01); *H01L 21/67109* (2013.01)
USPC ................. 134/35; 134/33; 134/34; 118/724; 156/345.37

(58) Field of Classification Search
CPC ..................... H01L 21/67017; H01L 21/6715; H01L 21/68714; H01L 21/68771; H01L 21/68764; H01L 21/6838
USPC .............. 118/715, 724, 723 MP; 156/345.34, 156/345.37, 345.38; 134/18, 32, 33, 34, 35
See application file for complete search history.

(56) References Cited

U.S. PATENT DOCUMENTS

| 2002/0033183 | A1* | 3/2002 | Sun et al. ........................ 134/1.1 |
| 2002/0036077 | A1* | 3/2002 | Getchel et al. ............... 165/80.1 |
| 2006/0254612 | A1* | 11/2006 | Farrar ............................. 134/1.1 |
| 2011/0070370 | A1* | 3/2011 | Teo et al. ................. 427/255.28 |
| 2011/0139183 | A1* | 6/2011 | Mikhaylichenko et al. .... 134/18 |

* cited by examiner

*Primary Examiner* — Saeed T Chaudhry
(74) *Attorney, Agent, or Firm* — Kusner & Jaffe

(57) ABSTRACT

The invention relates to a device for loosening a polymer layer from a surface of a substrate.

15 Claims, 2 Drawing Sheets

DEVICE AND METHOD FOR LOOSENING A POLYMER LAYER FROM A SURFACE OF A SUBSTRATE

FIELD OF THE INVENTION

The invention relates to a device and a method for loosening a polymer layer from a surface of a substrate according to Claim 1 or Claim 10.

BACKGROUND OF THE INVENTION

Polymers, in particular photoresists, applied to substrates, are removed in the prior art by acids and/or bases in a one-stage or multi-stage process, whereby in many cases, another layer that can be loosened more easily can be applied below the photoresist, permanent in this case, between the substrate and the permanent photoresist.

Depending on the polymers that are suitable for the corresponding application with the desired physical and chemical properties, the problem often exists that the detachment of an optimum polymer is especially difficult since these polymers in most cases are applied to the substrate as a permanent polymer layer, as is predominantly the case in particular in the lithography method in the modern semiconductor industry.

An example of a method and a device for loosening a polymer layer is shown in US 2002/0033183 A1.

Since in particular the permanent polymer layers have especially good physical and/or chemical properties, the technical problem is presented that the polymer layers are not designed to be detached.

In the detaching or loosening of such polymer layers, there therefore exists in particular the problem that strong chemical reactants have to be used, which are difficult to handle and whose optimum reaction temperature is to be maintained as exactly as possible in order to produce an optimum action.

With respect to the above-mentioned technical problems, therefore, the object is to indicate a device or a method with which as exact maintenance as possible of the chemical/physical parameters necessary for the loosening of the polymer layer is made possible, with at the same time detachment/loosening of the polymer layer that is as quick and complete as possible.

This object is achieved with the features of Claims 1 and 10. Advantageous further developments of the invention are indicated in the subclaims. All combinations that consist of at least two of the features that are indicated in the description, in the claims, and/or the drawings, also fall within the scope of the invention. In the indicated ranges of values, values that lie within the above-mentioned limits are also to be considered to be disclosed and can be claimed in any combination.

SUMMARY OF THE INVENTION

In accordance with a preferred embodiment of the present invention, there is provided a device for loosening a polymer layer from a surface of a substrate, in particular waters, comprised of: a substrate holding means for the receiving of the substrate, in particular on a rear side of the substrate opposite to the top side, application means for applying a fluid for loosening the polymer layer to the polymer layer, in particular the entire top side of the polymer layer, and heating means for introducing heat into the fluid by contact of a heating surface of the heating means with the fluid that is applied to the polymer layer.

The invention is based on the idea of introducing the temperature that is optimal for loosening the polymer layer via the fluid that loosens the polymer layer directly into the fluid that is applied to the polymer layer in such a way that the heating is done at least predominantly by heat conduction, i.e., direct contact of a heating means with the fluid. In this connection, the temperature of the fluid can be influenced quickly and accurately. Advantageously, it is therefore in particular possible, according to the invention, to measure the temperature of the fluid by installing corresponding temperature sensors in the heating means. A temperature measurement of the fluid can even be dispensed with, according to the invention, by the temperature of the heating surface of the heating means being used for control.

In addition, it is made possible according to the invention to eliminate an intermediate layer that is introduced between the polymer layer and the substrate in such a way that only the polymer layer that is to be applied on the substrate, in particular the permanent polymer layer, is preferably applied as a permanent photoresist. This results in a simplification and acceleration of the method and at the same time is more economical.

According to an advantageous embodiment of the invention, it is provided that in addition to the heating means at the substrate holding means, in particular at a contact surface of the substrate holding means with the substrate, substrate heating means for heating the substrate and/or insulating media for insulating the substrate for reducing the heat flow are provided. By these measures, the temperature gradient from the heating surface to the contact surface is minimized in such a way that in the polymer layer at an increasing distance from the heating surface of the heating means a nearly homogeneous temperature distribution or an approximately constant temperature distribution can be achieved.

By virtue of the fact that the heating means can be arranged at a distance from the polymer layer, in particular parallel to the top side of the polymer layer, whereby the distance can be adjusted, in particular by moving the heating surface preferably perpendicularly to the top side, further optimization of the temperature distribution along the fluid that is located on the polymer layer is achieved.

Advantageously, the heating surface has a diameter H of at least one-third, in particular at least approximately one-half, of the diameter D of the polymer layer or approximately one-half of the diameter D, or it corresponds approximately to the diameter D. The above-mentioned alternative embodiments represent the especially advantageous embodiments according to the invention, and the heating of the fluid on the polymer layer is correspondingly accelerated by a larger heating surface.

If the substrate holding means has rotating means for rotating the substrate around its center Z, on the one hand, the fluid can be optimally distributed on the polymer layer, and, on the other hand, an arrangement of the heating means in addition to the introducing means may be possible, which is not possible in a whole-area heating surface.

According to another advantageous embodiment of the invention, it is provided that the application means comprise a feeder that can be arranged above the polymer layer to convey the fluid from a fluid storage space to the top side of the polymer layer.

In another advantageous embodiment of the invention, it is provided that the fluid storage space is designed as a mixing chamber for mixing the fluid that consists of various substances that can be fed through pipes. In this connection, the fluid storage space performs several functions.

By the measure that the application means comprise preheating means for heating the fluid before application on the polymer layer, the method can be further accelerated and the temperature gradient on the heating surface is lower.

By having the device comprise a working area that is limited by a housing, in particular that can be subjected to a vacuum, in which working area the substrate holding means, the application means, and the heating means are at least partially arranged, whereby the housing has a polymer layer that is dissolved by the fluid via an outlet for producing the mixture from the fluid, the environment is optimally protected from the highly reactive substances in the fluid.

BRIEF DESCRIPTION OF THE DRAWINGS

Other advantages, features and details of the invention are produced from the subsequent description of preferred embodiments and are based on the drawings. The latter are shown in.

DETAILED DESCRIPTION OF PREFERRED EMBODIMENTS

In the figures, the same components and components with the same function are referred to by the same reference numbers.

Figure 1:
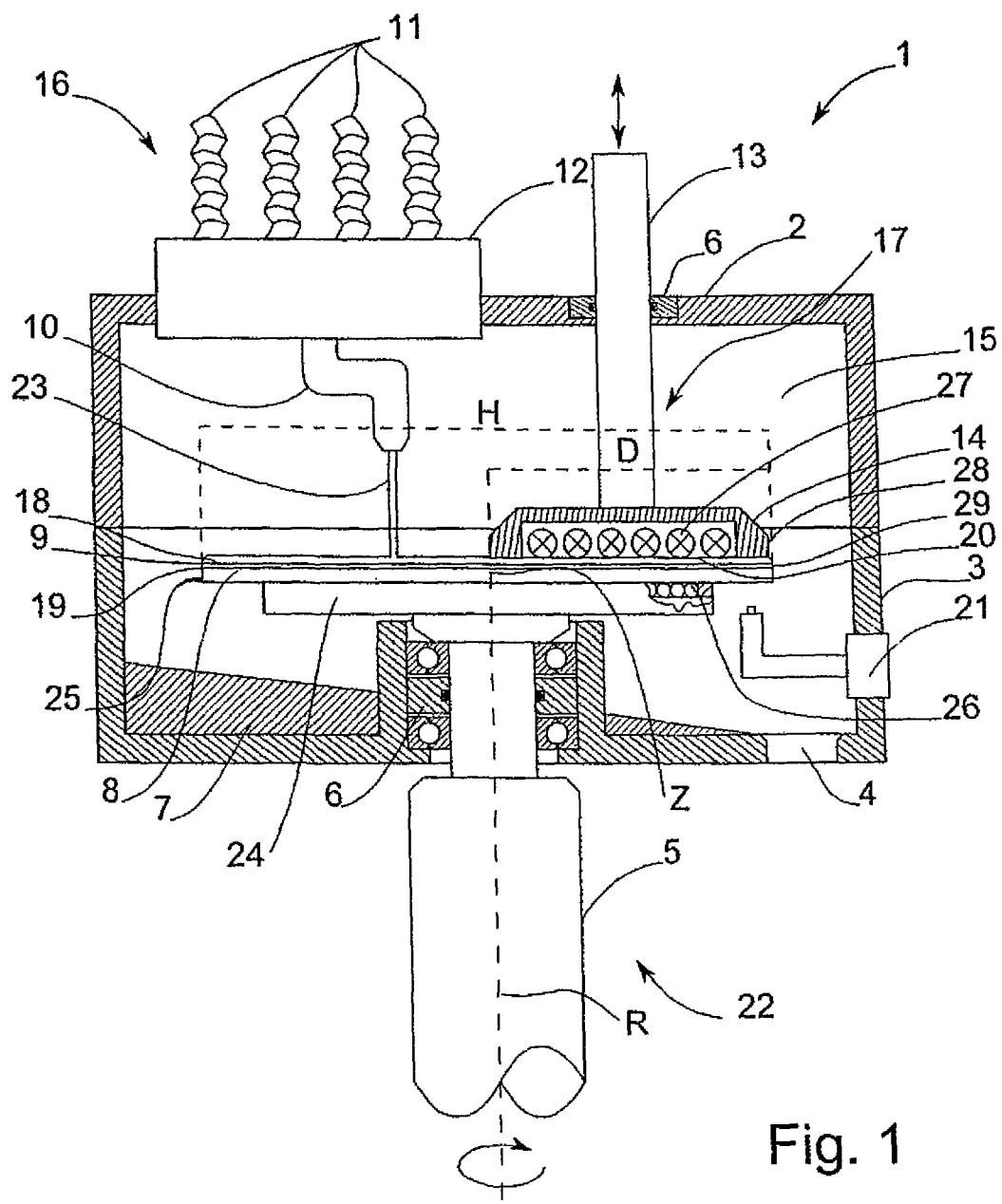
FIG. 1: A diagrammatic design of a device of the invention according to a first embodiment in cross-section.
Figure 2:
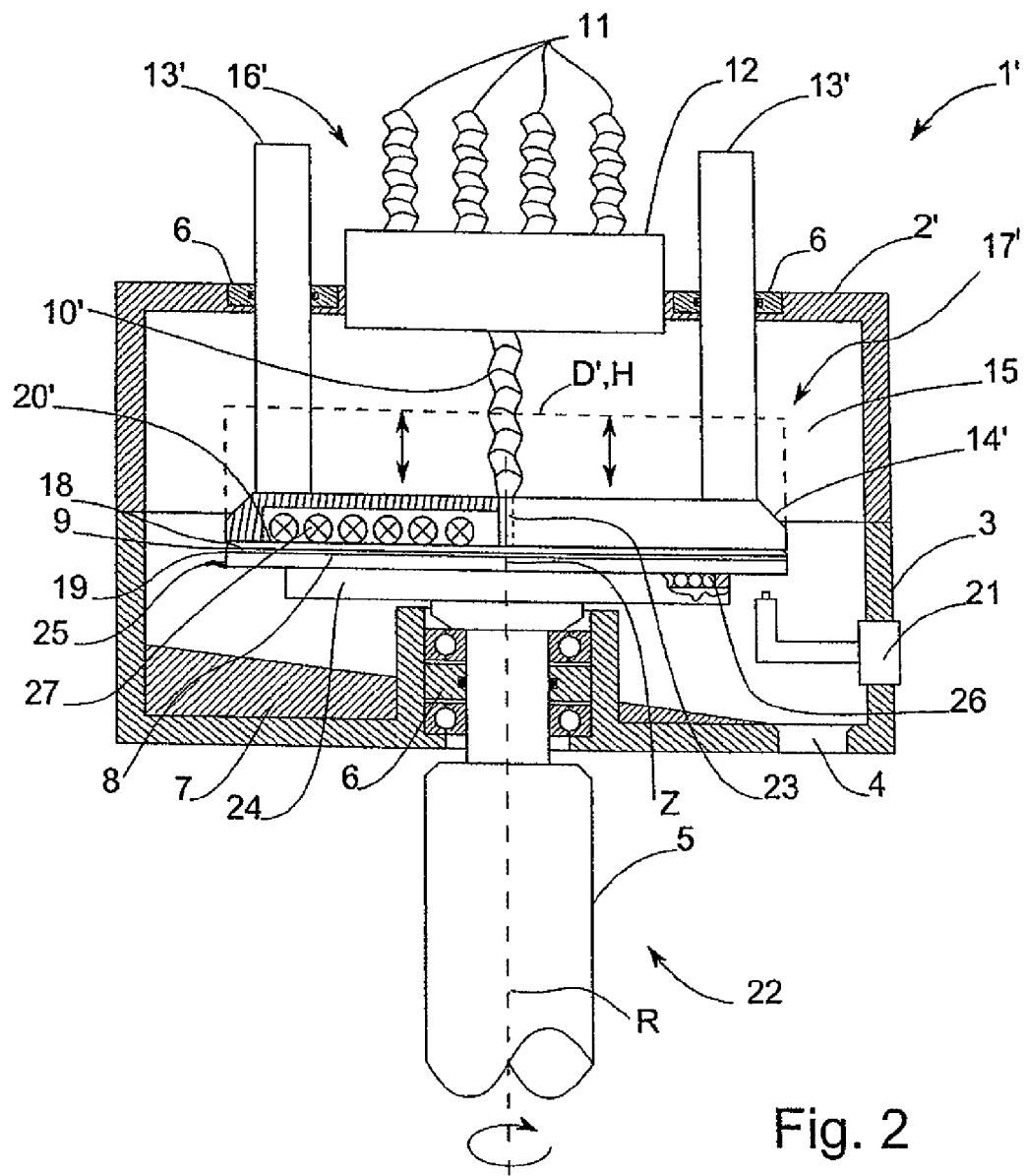
FIG. 2: A diagrammatic design of a device of the invention according to a second embodiment of the invention.

In each case, FIGS. 1 and 2 show a device that is to chemically remove a polymer layer 18, in particular a permanent photoresist, from a substrate 8, in particular a wafer. Unless otherwise described below, the components of the device cited below have the same design or the same function, so that the design and the function are first described in the example of FIG. 1.

The device consists of a housing 1, 1', which is built from a top part 2, 2' and a base part 3 that carries the top part 2, 2'. The housing 1, 1' can alternatively also be designed in one piece with a cover or a lateral, sealable opening.

The housing 1, 1' encloses a working area 15, in which the polymer layer 18 is dissolved by the fluid 23. At the lowest point of the housing 1, 1', an outlet 4 is provided, through which excess fluid 23 or a mixture of the fluid 23 and the polymer layer 18 that is dissolved by the fluid 23 is suctioned off, in particular by a vacuum system, not shown, which can be used at the same time for subjecting the working area 15 to a vacuum. In addition, a separator and/or a filter can be provided at the outlet 4.

The substrate 8 is held by a specimen holder 24 of a substrate holding means 22 and attached by commonly used means, for example, suction webs provided on the surface of the specimen holder 24 specifically in an aligned position. The aligned position means that a center Z of the substrate 8, in particular its centroid of the area or geometric mean, is on an axis of rotation R of the substrate holding means 22 that can be rotated by a shaft 5.

The substrate 8 rests with its rear side 25 on the surface of the specimen holder 24. The polymer layer 18 on a top side 19 of the substrate 8 that is opposite to the rear side 25 is wetted, in particular covered over the entire surface, with the fluid 23 by application means 16, 16'. The application means 16, 16' consist of pipes 11 that introduce one or more substances and/or gases into a fluid storage space 12 that acts as a mixing chamber, whereby a specific proportion is given and/or can be adjusted by a control, not shown. A mixing of liquids and/or gases in the fluid 23 takes place in the mixing chamber. Each of the pipes 11 can advantageously be designed to be heatable by a preheating system (not shown) to preheat the liquid or the gas to a specified temperature. In addition or alternatively, the possibility exists of preheating the fluid storage space 12 with a preheating system, in particular to a temperature that is close to the optimum process temperature of the fluid 23. With the control system, the fluid 23 is applied to the polymer layer 18 via a feeder 10, 10' and is distributed homogeneously there automatically or by rotation of the substrate holding means 22.

According to an advantageous embodiment, the specimen holder 24 is designed in such a way that as much heat insulation as possible relative to the substrate 8 is provided or the specimen holder 24 is provided with an additional heating system.

According to a preferred embodiment, the specimen holder 24 has a number of contact points that rest on the rear side 25, formed in particular by a spherical surface or a number of spheres 26 that are inserted into a tub of the specimen holder, by which the insulating action is optimized with air or a vacuum as an insulating medium.

According to an alternative embodiment, the specimen holder 24 can be at least partially made of a material that has a low thermal conductivity.

After applying the fluid 23 to the polymer layer 18, the polymer layer 18 is heated by heating means 17, 17' to the optimum process temperature of the fluid 23. The heating means 17, 17' consist of at least one guide arm 13, 13' that can move perpendicularly to a top side 9 of the polymer layer 18, specifically controlled by the control system. At the lower end of the guide arm 13 or the guide arms 13', a heating system 14, 14' is attached to a heating surface 20, 20' that is oriented in a parallel manner to the top side 9 and that can be heated by heating coils 27 with an adjustable temperature.

Instead of heating coils 27, it is possible to provide infrared or induction heating in an alternative embodiment of the invention. It is critical that the heating surface 20, 20' that contacts the fluid 23 applied to the polymer layer 18 be preferably immersed in the fluid.

In a more advantageous embodiment of the invention, a distance measurement for measuring the distance between the heating surface 20, 20' and the polymer layer 18 is provided in the heating system 14, 14'.

In the embodiment shown in FIG. 1, the heating system 14 has a diameter D of approximately one-half of the diameter H of the polymer layer 18. The heating surface 20 therefore extends in a cross-section over one-half of the diameter H of the polymer layer 18, whereby one edge 28 of the heating surface 20 is arranged in the area of an edge 29 of the polymer layer 18, in such a way that when the substrate 8 is rotated by the substrate holding means 22 around the axis of rotation R, at the latest after one complete revolution of the substrate 8 around the axis of rotation R, the polymer layer 18 or the fluid 23 has been completely exposed to the heating surface 20.

In the case of the embodiment of the invention that is shown in FIG. 2, the diameter D' of the heating system 14' is approximately the same size as the diameter H of the polymer layer 18, so that the heating surface 20' essentially corresponds to the surface of the top side 9 of the polymer layer 18. This has the advantage that the fluid 23 heats more quickly. In this respect, the design of the feeder 10' is more expensive, since the latter, in the embodiment that is shown, runs through the heating system 14' in the area of the center Z in such a way that the fluid 23 can be applied to the polymer layer 18 approximately in the area of the center Z.

The guide arms 13, 13', for example, can be driven by linear motors, controlled by the control system, whereby for advantageous arrangement of the drives, the guide arms 13, 13' are arranged outside of the working area 15 running through the housing 1, 1'. In this case, it is especially advantageous to seal the guide arms 13, 13' by seals 6 so that nothing can escape from the working area 15 via this pathway. At the same time, in this respect, the size of the working area 15 is minimized and makes it possible to apply a higher and constant vacuum.

It is also advantageous to arrange the shaft 5 and its rotary drive, not shown, outside of the working area 15 in such a way that the shaft 5 is designed to run through the housing 1, 1', and a seal 6 is also provided here.

So that the fluid 23 and/or the mixture that consists of fluid 23 and the polymer of the polymer layer 18 that is dissolved by fluid proceeds better to the outlet 4, a gradient system 7 for producing a gradient is provided here in the form of an incline. The gradient system 7 can also be provided by shaping the base part 3 accordingly.

After the polymer layer 18 is dissolved by the fluid 23 and optionally has been centrifuged off by rotation of the substrate holding means 22, a purification of the substrate 8 takes place, in particular with water and/or solvents and/or chemicals, provided for this purpose, which are applied to the substrate 8 by the application means 16, 16'. According to an alternative embodiment of the invention, a separate application system is provided for the purification liquid so as not to contaminate the purification liquid with chemical residues of the fluid 23 in the application means 16, 16'.

In addition, a separate purification system 21 for purifying the base side of the substrate, in particular on the edge of the substrate 8, is provided, whereby the purification preferably is carried out by the substrate holding means 22 at a location on the periphery of the substrate 8 during the rotation of the substrate 8.

Moreover, in one embodiment of the invention, it is provided to flush the top side of the substrate 8 and/or the heating system 14, 14' with an inert gas, in particular nitrogen, to prevent an oxidation or ignition reaction by the high temperatures.

Having described the invention, the following is claimed:

1. Device for loosening a polymer layer from a surface of a substrate, said device comprised of:
    a substrate holding means having a contact surface for receiving the substrate,
    application means for applying a fluid for loosening the polymer layer, said application means having an outlet oriented toward a top side of the polymer layer disposed on the substrate, and
    heating means for introducing heat into the fluid, said heating means having a heating surface disposed in contact with the fluid when the fluid is disposed on the polymer layer such that the heating means contacts the fluid after the fluid has exited the outlet of the application means.

2. Device according to claim 1, further comprising:
    a heating means on the substrate holding means,
    substrate heating means for heating the substrate, and
    insulating means for insulating the substrate for reducing heat loss.

3. Device according to claim 1, wherein the heating means is disposed a predetermined distance from the polymer layer, wherein the predetermined distance can be adjusted by moving the heating surface in a direction perpendicular to the contact surface of the substrate holding means.

4. Device according to claim 3, wherein said heating means is disposed parallel to said contact surface of said substrate holding means.

5. Device according to claim 1, wherein the heating surface has a diameter H of at least one-third of the diameter D of the polymer layer disposed on the substrate.

6. Device according to claim 1, wherein the substrate holding means has rotating means for rotating the substrate around its center Z.

7. Device according to claim 1, wherein the application means comprises a feeder that can be arranged above the polymer layer disposed on the substrate to convey the fluid from a fluid storage space to the top side of the polymer layer.

8. Device according to claim 7, wherein the fluid storage space is designed as a mixing chamber for mixing fluid that consists of various substances that can be fed through pipes.

9. Device according to claim 1, wherein the application means comprises;
    a chamber for holding a fluid; and
    a preheating means for heating the fluid disposed in said chamber before said fluid is applied to the polymer layer.

10. Device according to claim 1, further comprising:
    a housing defining a working area, said working area dimensioned to receive at least portions of the substrate holding means, the application means, and the heating means, whereby the housing has an outlet for drainage of a mixture from the fluid and a polymer layer that is dissolved by the fluid.

11. Device according to claim 10, wherein said working area is fluidly connected to a source of a vacuum.

12. Device according to claim 1, wherein said contact surface of said substrate holding means is a top side thereof.

13. Device according to claim 1, wherein said diameter H of said heating surface is at least one half the diameter D of the polymer layer.

14. Device according to claim 1, wherein said diameter H of said heating surface equals said diameter D of the polymer layer.

15. Method for loosening a polymer layer from a surface of a substrate, in particular wafers, with the following steps:
    receiving of the substrate on a substrate holding means,
    applying a fluid for loosening the polymer layer to the polymer layer by application means, and
    introducing heat into the fluid by heating means, whereby a heating surface of the heating means is brought into contact with the fluid that is applied to the polymer layer such that the heating means contacts the fluid after the fluid has exited the outlet of the application means.

* * * * *